United States Patent
Aoyama (10) Patent No.: US 9,257,299 B2
(45) Date of Patent: Feb. 9, 2016

(54) METHOD OF MANUFACTURING SEMICONDUCTOR DEVICE AND SEMICONDUCTOR MANUFACTURING APPARATUS

(71) Applicant: Kabushiki Kaisha Toshiba, Minato-ku, Tokyo (JP)

(72) Inventor: Tomonori Aoyama, Mie-ken (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 70 days.

(21) Appl. No.: 14/192,487

(22) Filed: Feb. 27, 2014

(65) Prior Publication Data

US 2015/0093903 A1 Apr. 2, 2015

(30) Foreign Application Priority Data

Sep. 30, 2013 (JP) ................................. 2013-205882

(51) Int. Cl.
*H01L 21/311* (2006.01)
*H01L 21/027* (2006.01)
*C23C 16/18* (2006.01)

(52) U.S. Cl.
CPC .......... *H01L 21/31116* (2013.01); *C23C 16/18* (2013.01); *H01L 21/0271* (2013.01); *H01L 21/31144* (2013.01)

(58) Field of Classification Search
CPC ................ C23C 16/18; H01L 21/0271; H01L 21/31116; H01L 21/31144
See application file for complete search history.

(56) References Cited

U.S. PATENT DOCUMENTS

| | | | | |
|---|---|---|---|---|
| 4,600,686 A * | 7/1986 | Meyer | ..................... | G03F 7/405 156/328 |
| 4,873,176 A * | 10/1989 | Fisher | ................... | G03F 7/0226 216/13 |
| 5,030,549 A * | 7/1991 | Hashimoto | ........... | G03F 7/0047 430/296 |
| 5,236,550 A * | 8/1993 | Abt | ................... | H01L 21/32136 216/67 |
| 5,536,584 A * | 7/1996 | Sotokawa | ............... | B32B 15/08 257/E23.167 |
| 5,648,198 A | 7/1997 | Shibata | | |
| 5,837,804 A * | 11/1998 | Yamagishi | ............. | C08G 73/10 264/331.19 |
| 5,876,903 A * | 3/1999 | Ng | ...................... | H01L 21/0274 257/E21.027 |
| 6,031,653 A * | 2/2000 | Wang | ..................... | G02B 5/288 359/247 |
| 6,200,903 B1 | 3/2001 | Oh et al. | | |
| 6,207,583 B1 * | 3/2001 | Dunne | .............. | H01L 21/02063 134/1.2 |
| 6,235,572 B1 * | 5/2001 | Kunitomo | ......... | H01L 21/02183 257/E21.01 |
| 6,271,154 B1 * | 8/2001 | Shen | ........................ | G03F 7/40 216/49 |
| 6,589,709 B1 * | 7/2003 | Okoroanyanwu | | H01L 21/28123 250/492.3 |

(Continued)

FOREIGN PATENT DOCUMENTS

| | | |
|---|---|---|
| JP | 07-130631 A | 5/1995 |
| JP | 2003-273291 A | 9/2003 |

*Primary Examiner* — Brett Feeney
*Assistant Examiner* — Sophia Nguyen
(74) *Attorney, Agent, or Firm* — White & Case LLP (57) ABSTRACT

According to one embodiment, a method of manufacturing a semiconductor device includes forming a resist and a layer to be etched on a substrate, forming a non-cured layer on the resist by supplying a metal compound containing Ru, forming a cured layer on a surface layer of the resist by using the non-cured layer, and etching the layer to be etched by reactive ion etching using the cured layer and the resist as a mask.

12 Claims, 6 Drawing Sheets

(56) References Cited

U.S. PATENT DOCUMENTS

| | | | | |
|---|---|---|---|---|
| 6,653,231 B2* | 11/2003 | Okoroanyanwu | H01L 21/28123 | 257/E21.206 |
| 6,699,792 B1* | 3/2004 | Wang | H01L 21/0271 | 257/E21.024 |
| 6,774,365 B2* | 8/2004 | Okoroanyanwu | H01L 21/28123 | 250/306 |
| 6,815,359 B2* | 11/2004 | Gabriel | H01L 21/0273 | 257/E21.206 |
| 7,022,611 B1* | 4/2006 | Keil | H01L 21/0273 | 257/E21.026 |
| 7,851,136 B2* | 12/2010 | Levinson | G03F 7/0035 | 430/313 |
| 8,018,678 B1* | 9/2011 | Zhang | G11B 5/1278 | 360/125.02 |
| 8,254,060 B1* | 8/2012 | Shi | G11B 5/3163 | 360/125.08 |
| 8,394,280 B1* | 3/2013 | Wan | G11B 5/1278 | 216/22 |
| 8,861,137 B1* | 10/2014 | Lam | G11B 5/1278 | 216/22 |
| 2003/0019834 A1* | 1/2003 | Hineman | H01J 37/32623 | 216/2 |
| 2004/0222185 A1* | 11/2004 | Kawai | C23F 4/00 | 216/22 |
| 2005/0161826 A1* | 7/2005 | Shah | H01L 21/4857 | 257/758 |
| 2006/0003269 A1* | 1/2006 | Ito | B82Y 10/00 | 430/323 |
| 2006/0065829 A1* | 3/2006 | Lu | G01N 1/32 | 250/307 |
| 2006/0223300 A1* | 10/2006 | Simka | C23C 16/18 | 438/618 |
| 2006/0276036 A1* | 12/2006 | Nagashima | C23C 14/352 | 438/678 |
| 2008/0003795 A1* | 1/2008 | Kojima | G11B 5/3906 | 438/597 |
| 2010/0086880 A1* | 4/2010 | Saito | G11B 7/261 | 430/325 |
| 2010/0163422 A1* | 7/2010 | Hsiao | G11B 5/1278 | 205/122 |
| 2011/0086240 A1* | 4/2011 | Xiang | G11B 5/1278 | 428/810 |
| 2011/0134567 A1* | 6/2011 | Chen | G11B 5/1278 | 360/123.12 |
| 2011/0304053 A1* | 12/2011 | Lin | G03F 7/0035 | 257/774 |
| 2012/0052328 A1* | 3/2012 | Sakurai | G11B 5/746 | 428/810 |
| 2013/0255717 A1* | 10/2013 | Rose | H01J 37/32862 | 134/1.1 |
| 2014/0334773 A1* | 11/2014 | Mathai | G02B 6/4292 | 385/14 |
| 2015/0069551 A1* | 3/2015 | Toko | H01L 43/12 | 257/421 |
| 2015/0118604 A1* | 4/2015 | Dynes | G01R 33/0052 | 430/5 |

* cited by examiner

FIG. 12

METHOD OF MANUFACTURING SEMICONDUCTOR DEVICE AND SEMICONDUCTOR MANUFACTURING APPARATUS

CROSS-REFERENCE TO RELATED APPLICATION

This application is based upon and claims the benefit of priority from Japanese Patent Application No. 2013-205882, filed Sep. 30, 2013; the entire contents of which are incorporated herein by reference.

FIELD

Embodiments described herein relate generally to a method of manufacturing a semiconductor device and a semiconductor manufacturing apparatus.

BACKGROUND

In a reactive ion etching (RIE) process using a resist in a semiconductor process, when a selection ratio of resist for a material to be etched is small, an etching amount of the resist increases more than necessary.

During the RIE using the resist as a mask, unevenness occurs in etching due to non-uniformity in hardness of the resist, non-uniformity of a plasma density during the RIE, and the like, and thus a width or a shape of a pattern is different in each region. As a result, roughness occurs in a pattern including the resist and a material to be subjected to the RIE.

An example of related art includes JP-A-2003-273291.

DETAILED DESCRIPTION

Exemplary embodiments are to provide a method of manufacturing a semiconductor device, which is capable of preparing an excellent pattern.

In general, according to one embodiment, there is provided a method of manufacturing a semiconductor device. The method includes forming a resist and a layer to be etched on a substrate, forming a non-cured layer on the resist by supplying a metal compound containing Ru or W, forming a cured layer on a surface layer of the resist by using the non-cured layer, and etching the layer to be etched by reactive ion etching using the cured layer and the resist as a mask.

First Embodiment

Figure 1:
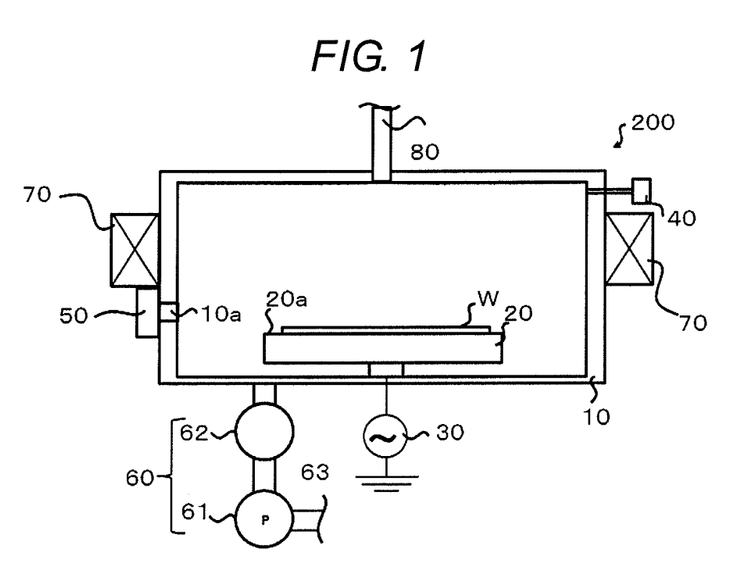
FIG. 1 is a view illustrating a schematic configuration of a semiconductor manufacturing apparatus according to a first embodiment.

FIG. 1 shows a schematic view illustrating a configuration of a semiconductor manufacturing apparatus 200 according to a first embodiment. The semiconductor manufacturing apparatus 200 includes a chamber 10, a stage 20, a bias voltage application unit 30, a gas supply unit 40, a gate valve 50, an evacuation unit 60, a coil (mechanism that generates plasma) 70, and a raw material supply nozzle 80.

The chamber 10 is a container that carries out a film formation process, and retains airtightness. The stage 20 and a wafer W are accommodated inside the chamber 10. An opening 10a through which the wafer W is carried in and carried out is formed in the chamber 10.

The stage 20 retains the wafer W on a top surface 20a. A semiconductor device 1 is formed by forming a pattern in the wafer W on the stage 20. In addition, due to the bias voltage application unit 30, the stage 20 may attract inert gas ions in plasma generated by the coil 70 to the wafer W, and may allow a layer 5 (non-cured layer), which is formed on a resist 4 and which contains a resist curing element, to be knocked on a surface of the resist 4.

The gas supply unit 40 is connected to a gas supply source (not shown) and supplies various kinds of gases to the inside of the chamber 10. The gas supply unit 40 includes a system that supplies a gas (for example, a $CF_4$ gas, a $C_2F_6$ gas, an $SF_6$ gas, an $NF_3$ gas, a $Cl_2$ gas, and a $BCl_4$ gas) necessary for dry cleaning of the chamber 10, and a system that supplies a gas (for example, an Ar gas and an $N_2$ gas) necessary for knock-on. These systems include a mass flow controller (MFC) that controls a gas flow rate for each kind of gas, and a valve that carries out supply and cut-off of a gas.

The gate valve 50 opens and closes the opening 10a of the chamber 10.

The evacuation unit 60 includes an evacuation pump 61 and a throttle valve 62. One end side of the evacuation unit 60 is connected to the chamber 10, and the other end side includes a vacuum pipe 63 that is connected to the evacuation pump 61. The throttle valve 62 is disposed between the chamber 10 and the evacuation pump 61, and controls a pressure inside the chamber 10 by changing conductance of the vacuum pipe 63. In addition, an exhaust side of the evacuation pump 61 is connected to a detoxifying device (not shown).

The coil 70 controls plasma that is generated inside the chamber 10 by adjusting a magnetic field inside the chamber 10. As a power supply for plasma generation, a power supply such as an RF, an ICP, and an ECR may be used.

The raw material supply nozzle 80 is connected to the chamber 10, and supplies a metal compound that contains Ru into the chamber 10. It is preferable that the metal compound contains an organic material from the viewpoint that a vapor pressure of the metal compound containing the organic material is high, and thus it is possible to easily remove the metal compound. In this case, the metal compound is an organic metal complex, and specific examples of the organic metal complex include $Ru(EtCp)_2$, RuCpBuCp, or RuCpPrCp. Et represents an ethyl group, Pr represents a propyl group, Bu represents a butyl group, and Cp represents a cyclopentadienyl group. In addition, the metal compound containing the organic material is not limited to the above-described Ru compound, and may include a W compound. In addition, the metal compound may contain an inorganic material, and in this case, the metal compound is a compound that contains, for example, a halide.

The semiconductor manufacturing apparatus 200 may carry out a process of forming a film 5 that contains a resist curing element, a process of introducing an inert gas, and a process of carrying out knock-on by anisotropic plasma in succession in the same chamber 10. Each part of an apparatus may be reduced, and thus it is possible to suppress a cost increase during manufacturing. In addition, the semiconductor manufacturing apparatus 200 may have a configuration in which a chamber used during formation of the film 5 that contains the element to cure the resist and a chamber used during the knock-on by plasma of an inert gas are connected to each other.

Figure 2:
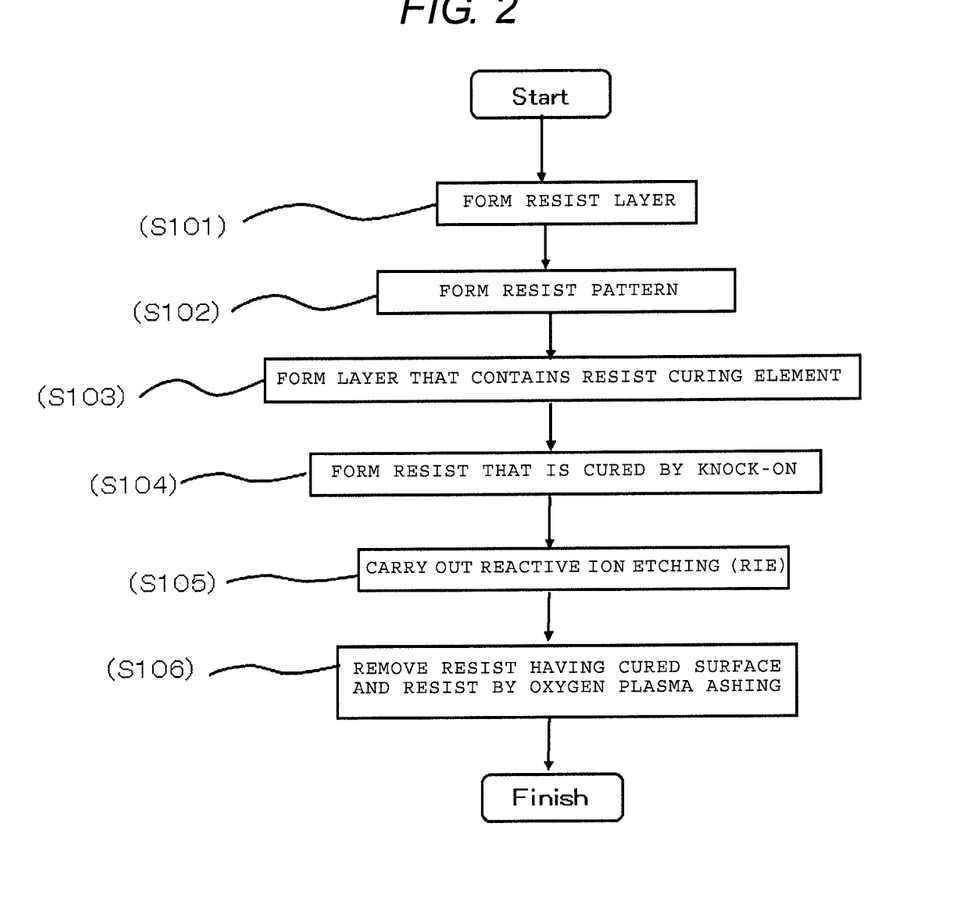
FIG. 2 is a flowchart illustrating a method of manufacturing a semiconductor device according to the first embodiment.

FIG. 2 shows a flowchart illustrating a method of manufacturing the semiconductor device 1 according to the first embodiment. FIGS. 3 to 8 show process cross-sectional views illustrating the method of manufacturing the semiconductor device 1 according to the first embodiment.

Figure 3:
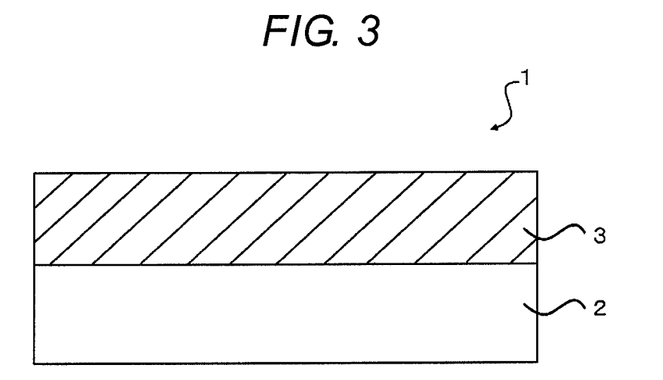
FIG. 3 is a process cross-sectional view illustrating the method of manufacturing a semiconductor device according to the first embodiment.

As shown in FIG. 3, a layer 3 to be etched (hereinafter, also referred to as an etched layer 3 after being subjected to an etching process) is formed on a substrate 2 (step S101). The layer 3 to be etched is a layer that includes an oxide such as $SiO_2$.

Figure 4:
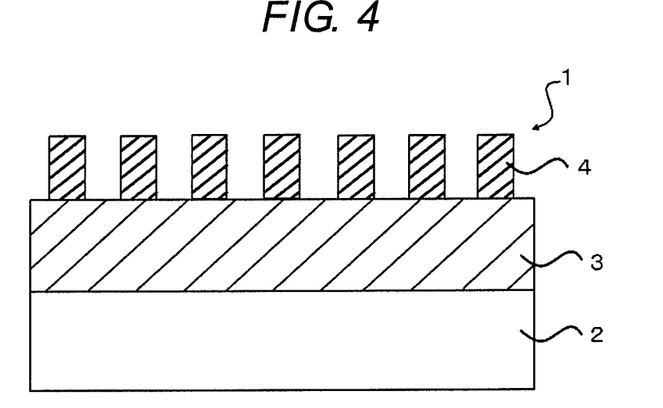
FIG. 4 is a process cross-sectional view illustrating the method of manufacturing a semiconductor device according to the first embodiment.

As shown in FIG. 4, first, a resist 4 is formed (step S102). For example, the resist 4 is a compound that contains an organic material.

Figure 5:
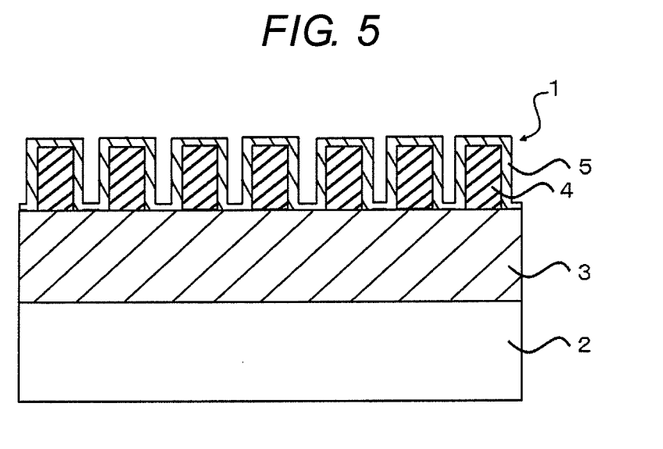
FIG. 5 is a process cross-sectional view illustrating the method of manufacturing a semiconductor device according to the first embodiment.

As shown in FIG. 5, Ru is deposited on the layer 3 to be etched and the resist 4 according to a plasma CVD method to form the layer 5 that contains a resist curing element (step S103). Here, the element of the layer 5 which is contained for resist curing represents Ru. The thickness of the layer 5 that contains the resist curing element is preferably 10 nm or less. According to this, the layer 5 that contains the resist curing element gets into the resist 4 in the following knock-on process (step S104), and thus it is possible to prevent the resist 4 from being swelled by a thickness of the resultant embedded layer.

Figure 6:
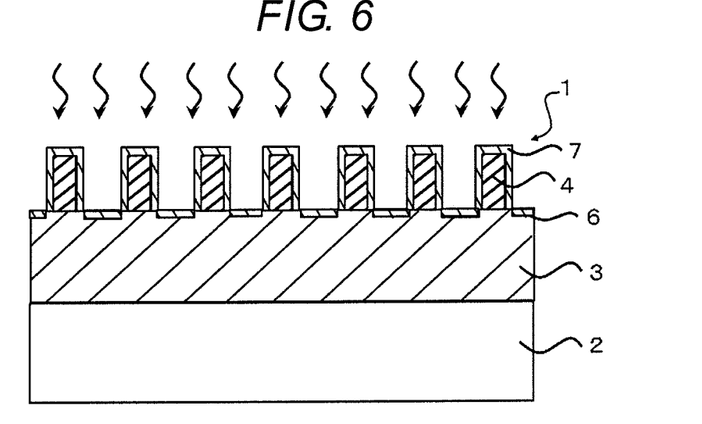
FIG. 6 is a process cross-sectional view illustrating the method of manufacturing a semiconductor device according to the first embodiment.

As shown in FIG. 6, a magnetic field is controlled by controlling a bias to be applied to the coil 70 during introduction of an inert gas to generate plasma. In addition, a bias is applied to the stage 20 from the bias voltage application unit 30 to irradiate the substrate 2 with anisotropic inert gas ions, thereby carrying out a (knock-on) process of ejecting Ru atoms by using the resultant incident inert gas ions (step S104). According to this, a resist 7 having a cured surface is formed on a surface layer of the resist 4. At this time, the layer 5 that contains the resist curing element is also embedded in the layer 3 to be etched, and thus a layer 6 that contains Ru is also formed.

In addition, examples of the inert gas that is introduced in the process include gases such as Ne, Ar, Kr, and Xe. In addition, it is preferable that a pressure be as high as possible in a range capable of generating plasma. For example, the pressure is preferably set to 0.1 Pa or higher by induction of the inert gas. Inert gas ions are emitted by bias application in a direction perpendicular to the substrate 2. However, when the inert gas ions collide with or are repelled from the substrate 2 by increasing the pressure in a vapor phase, it is possible to increase momentum of in a horizontal direction with respect to the substrate 2. According to this, knock-on may also be carried out on a side surface of the resist 4.

Figure 7:
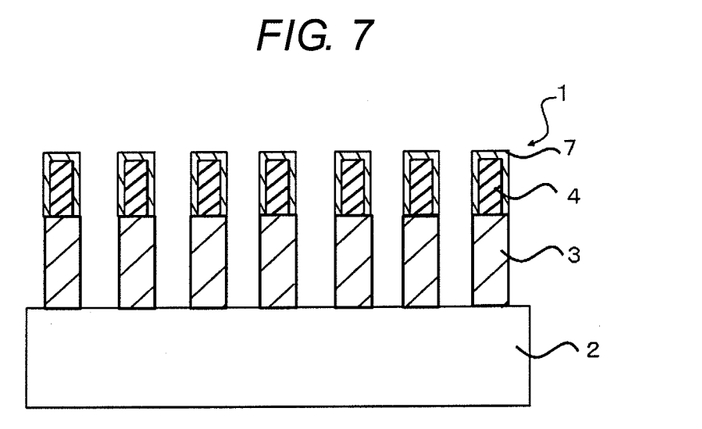
FIG. 7 is a process cross-sectional view illustrating the method of manufacturing a semiconductor device according to the first embodiment.

As shown in FIG. 7, the layer 3 to be etched is etched according to a plasma reactive ion etching (RIE) method by using the resist 7 having a cured surface and the resist 4 as a mask (step S105). The etching is carried out by introducing an etching gas of an oxide that constitutes the layer 3 to be etched into the chamber 10, and by irradiating the substrate 2 with anisotropic ions by bias application.

The resist 7 having a cured surface does not contain a lot of O atoms, and thus the resist 7 is not likely to react with Ru atoms. Therefore, the resist 7 having a cured surface is not likely to be etched, and thus remains on the surface layer of the resist 4.

On the other hand, the layer 6 that contains Ru reacts with oxygen atoms in the layer 3 to be etched during the RIE process, and thus volatile $RuO_4$ is formed. $RuO_4$ vaporizes immediately in an initial stage of the RIE, and thus $RuO_4$ does not remain on the substrate 2. Accordingly, the layer 6 containing Ru does not have a great effect on processing of the layer 3 to be etched.

Figure 8:
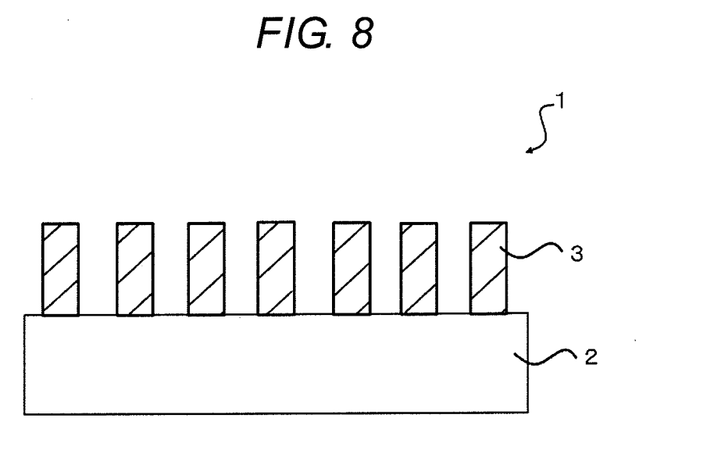
FIG. 8 is a process cross-sectional view illustrating the method of manufacturing a semiconductor device according to the first embodiment.

As shown in FIG. 8, an oxygen plasma ashing process is carried out to remove the resist 4 and the resist 7 which has a cured surface and which remains on the surface layer of the resist 4 (step S106). Ru reacts with oxygen during the oxygen ashing process using oxygen to form $RuO_4$, and the $RuO_4$ vaporizes, and thus Ru does not remain on the substrate 2. The resultant etched layer 3 remains on the substrate 2, and thus a pattern by the layer 3 is formed.

An effect of the method of manufacturing a semiconductor device according to this embodiment will now be described.

In the method of manufacturing a semiconductor device according to this embodiment, since the resist 7 having a cured surface is formed on the surface layer of the resist 4, the resist 4 is protected during the RIE, and thus etching of the resist 4 itself is suppressed. According to this, it is possible to prevent a variation from occurring in a shape of the resist 4, and thus it is possible to prepare a uniform and excellent pattern.

Figure 9:
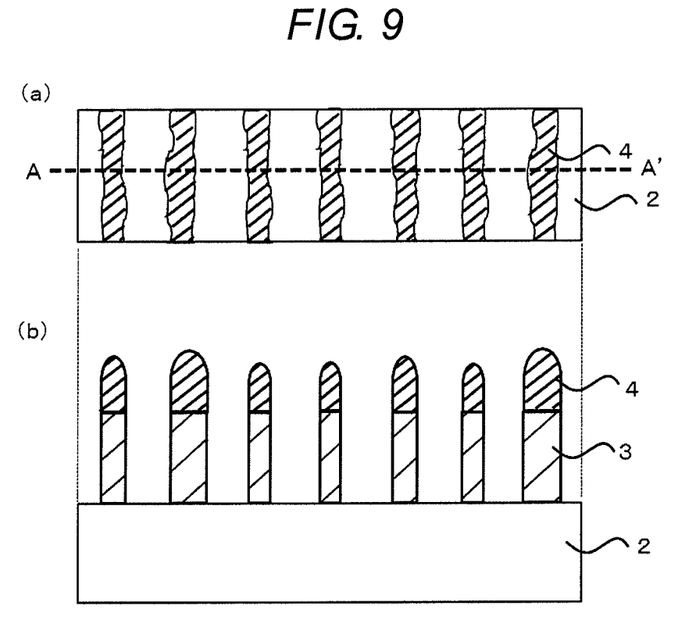
FIG. 9 is a view illustrating a semiconductor device that is obtained by carrying out reactive ion etching (RIE) without forming a resist having a cured surface.

An examination will be made with respect to a configuration in which the resist 7 having a cured surface is not formed. FIG. 9 is a view illustrating a semiconductor device that is obtained by carrying out the reactive ion etching (RIE) without forming the resist 7 having a cured surface. (a) of FIG. 9 shows a plan view of a semiconductor device, and (b) of FIG. 9 shows a cross-sectional view taken along a line A-A' in the plan view. The layer 3 to be etched is etched by irradiation of anisotropic ions during the RIE. However, during the RIE process using the resist 4 as a mask, roughness occurs in a pattern constituted by the resist 4 and the etched layer 3 due to non-uniformity in hardness of the resist 4, non-uniformity of a plasma density during the RIE, and the like.

First Modification Example

In a first modification example, a CO gas is added as an introduction gas in step S105. For example, the layer 3 to be etched (i.e., the etched layer 3) is a compound which contains Si and which does not contain an oxide.

In step S105, when the RIE is carried out by adding a CO gas as an introduction gas, the CO gas reacts with Ru in the layer 3 to be etched to form $Ru_3(CO)_{12}$ (step S105). On the other hand, the CO gas does not react with Ru atoms embedded in an organic material, that is, Ru atoms in the resist 7 having a cured surface. Accordingly, it is possible to selectively remove the layer 3 to be etched.

In step S106, the oxygen plasma ashing process is carried out to remove the resist 4 and the resist 7 which has a cured surface and which remains on the surface layer of the resist 4 (step S106). Ru reacts with oxygen during the oxygen ashing process using oxygen to form $RuO_4$, and the $RuO_4$ vaporizes, and thus Ru does not remain on the substrate 2.

In this modification example, the method of carrying out the RIE by introducing the CO gas as the introduction gas is effective for the layer 3 to be etched which does not contain an oxide of Si, a metal compound, and the like. In addition, the layer 3 to be etched, which is a target in this modification example, is not limited to Si or a metal compound, and even when containing an oxide such as $SiO_2$, the layer 3 to be etched may be selectively etched.

Second Modification Example

Figure 10:
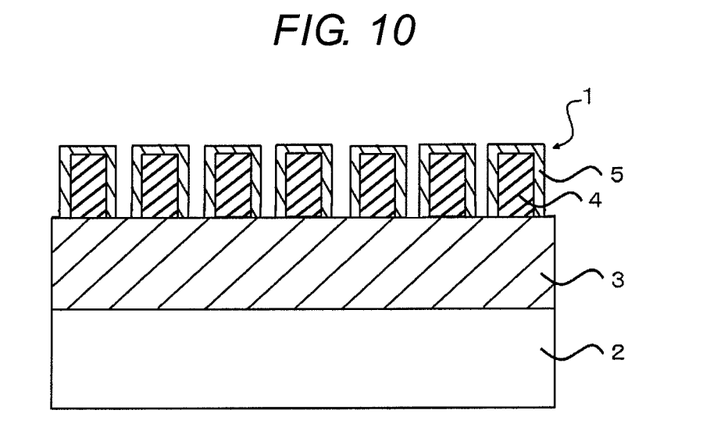
FIG. 10 is a process cross-sectional view illustrating a method of manufacturing a semiconductor device relating to a second modification example of the first embodiment.

In a second modification example, as shown in FIG. 10, in step S103, an Ru-containing gas is supplied from the raw material supply nozzle 80, and the wafer W is heated on the stage 20 from 100° C. to 200° C. to form the film 5 that contains a resist curing element (step S103). Similar to the first modification example, the layer 3 to be etched in this modification example is, for example, a compound which contains Si and which does not contain an oxide. In addition, in the first embodiment, the metal compound, which is supplied from the raw material supply nozzle 80, is decomposed by plasma generated by the coil 70 to form the film 5 that contains the resist curing element on the entire surface of the resist 4 by the plasma CVD method. However, in this modification example, plasma is not generated by the coil 70.

When forming the film 5 that contains the resist curing element, an incubation time is different between a surface of the resist 4 and a surface of the layer 3 to be etched which contains Si. Accordingly, Ru is not grown on the layer 3 to be etched while Ru is deposited on the resist 4 in a thickness of 10 nm or less. The incubation time represents a time taken until nucleation occurs after Ru is deposited on the layer 3 to be etched and the resist 4, or a time taken until the film that contains the resist curing element is formed. Accordingly, it is possible to selectively form the film 5 that contains the resist curing element only on the surface of the resist 4 without forming the film 5 that contains the resist curing element on the layer 3 to be etched.

Figure 11:
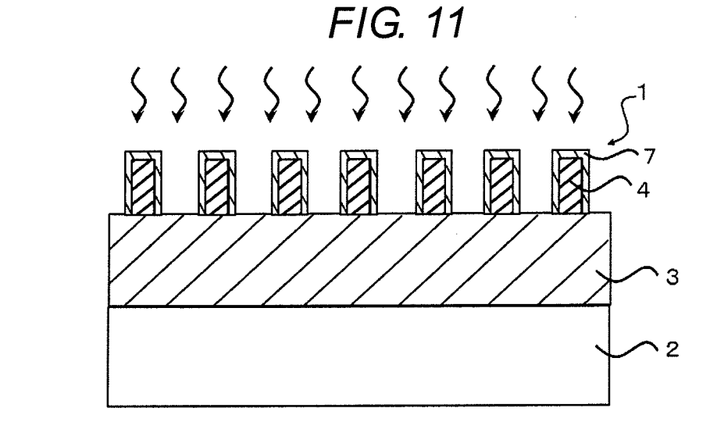
FIG. 11 is a process cross-sectional view illustrating a method of manufacturing a semiconductor device relating to a second modification example of the first embodiment.

In the knock-on process in step S104, as shown in FIG. 11, the resist 7 having a cured surface is formed. The film 5 that contains the resist curing element is not present on the layer 3 to be etched, and thus the layer 6 that contains Ru is not formed.

In this modification example, since the layer 6 that contains Ru is not formed and only the resist 7 having a cured surface is formed, it is possible to increase an effect of selectively etching the layer 3 to be etched during the RIE.

Second Embodiment

Figure 12:
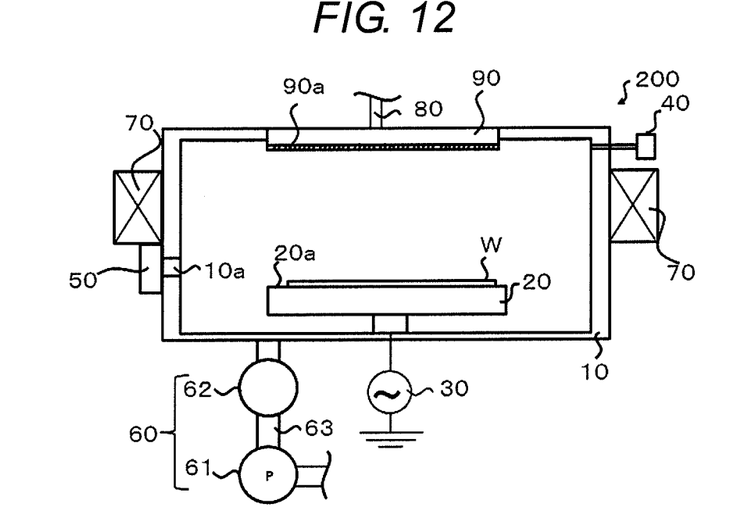
FIG. 12 is a view illustrating a schematic configuration of a semiconductor manufacturing apparatus according to a second embodiment.

A method of manufacturing a semiconductor device according to a second embodiment will now be described. FIG. 12 shows a view illustrating a schematic configuration of a semiconductor manufacturing apparatus 200 according to the second embodiment. In the semiconductor manufacturing apparatus 200, a spray nozzle 90 is provided inside the chamber 10. In the spray nozzle 90, a plurality of penetration holes 90a are provided to diffuse a metal compound supplied from the raw material supply nozzle 80 and to introduce the metal compound in the chamber 10.

A method of manufacturing the semiconductor device 1 is the same as the flowchart in FIG. 1.

The method of manufacturing the semiconductor device 1 according to the second embodiment will now be described. In the second embodiment, the same reference numerals will be given to the same configuration parts as the first embodiment, and description thereof will not be repeated. Description will be made with respect to the other parts.

A layer 3 to be etched according to the second embodiment is different from that in case of the first embodiment in that the resist 7 having a cured surface is formed by a spray method. In this case, a liquid metal compound is blown onto the substrate 2 to form the layer 5 that contains a resist curing element.

An effect of the method of manufacturing the semiconductor device 1 according to this embodiment will now be described. It is possible to form the layer 5 that contains the resist curing element by blowing the metal compound onto the substrate 2 by using the spray nozzle 90. In this case, it is possible to effectively form the film 5 that contains the resist curing element with a less raw material in comparison to the first embodiment. Further, power for generating plasma or power for raising a temperature of the wafer W is not necessary to form the film 5 that contains the resist curing element. As a result, it is possible to manufacture a semiconductor device at a low price.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, the method comprising:
    forming a resist and a layer to be etched on a substrate;
    forming a non-cured layer on the resist by supplying a metal compound containing Ru;
    forming a cured layer on a surface layer of the resist by using the non-cured layer; and
    etching the layer to be etched by reactive ion etching using the cured layer and the resist as a mask.

2. The method according to claim 1, further comprising:
    oxygen plasma asking of allowing oxygen plasma to react with the resist and the cured layer to remove the resist and the cured layer after the etching process.

3. The method according to claim 1,
    wherein the metal compound is an organic metal complex.

4. The method according to claim 1,
    wherein the metal compound is $Ru(EtCp)_2$, RuCpBuCp, or RuCpPrCp.

5. The method according to claim 1,
    wherein the non-cured layer is formed by blowing the metal compound.

6. The method according to claim 1, wherein the layer to be etched contains $SiO_2$.

7. The method according to claim 6, wherein the metal compound reacts with the layer to be etched and forms $RuO_4$.

8. The method according to claim 1, wherein the metal compound includes a halide.

9. The method according to claim 1, wherein a thickness of the non-cured layer is 10 nm or less.

10. The method according to any one of claim 1, wherein a gas containing CO is used during the reactive ion etching.

11. The method according to claim 10, wherein the gas which include the gas containing CO reacts with the non-cured layer and forms $Ru_3(CO)_{12}$.

12. The method according to claim 1, wherein the layer to be etched contains Si.

* * * * *